United States Patent [19]

Lewis, Jr. et al.

[11] 4,425,508

[45] Jan. 10, 1984

[54] ELECTRON BEAM LITHOGRAPHIC APPARATUS

[75] Inventors: George C. Lewis, Jr., Sudbury; Robert A. Vanslette, Medfield, both of Mass.

[73] Assignee: GCA Corporation, Bedford, Mass.

[21] Appl. No.: 375,867

[22] Filed: May 7, 1982

[51] Int. Cl.³ ............................................. G21K 5/10
[52] U.S. Cl. .............................. 250/442.1; 250/492.2; 277/3; 277/226; 277/DIG. 7; 29/722; 29/743; 29/DIG. 44
[58] Field of Search .............. 250/442.1, 441.1, 440.1, 250/492.2; 277/3, 226, DIG. 7; 29/722, 743, DIG. 44

[56] References Cited

U.S. PATENT DOCUMENTS

| | | | |
|---|---|---|---|
| 3,638,933 | 2/1972 | Burnette et al. | 269/60 |
| 3,722,996 | 3/1973 | Fox | 355/53 |
| 3,740,900 | 6/1973 | Youmans et al. | 51/235 |
| 4,014,555 | 3/1977 | Jacottet | 277/3 |
| 4,063,103 | 12/1977 | Sumi | 250/442.1 X |
| 4,191,385 | 3/1980 | Fox | 277/3 |
| 4,206,953 | 6/1980 | Diehl et al. | 308/9 |
| 4,275,983 | 6/1981 | Bergman | 414/676 |
| 4,354,686 | 10/1982 | Imanishi et al. | 277/3 |
| 4,361,332 | 11/1982 | Logan et al. | 277/3 |

Primary Examiner—Alfred E. Smith
Assistant Examiner—Jack I. Berman
Attorney, Agent, or Firm—Kenway & Jenney

[57] ABSTRACT

In the electron beam lithographic system disclosed herein, a semiconductor wafer to be exposed is carried on an air bearing puck which is, on both sides, supported or located by balanced annular regions of air pressure. These annular supporting regions surround central evacuated regions which are also balanced so that the puck is not subject to large bending forces. Accordingly, the puck can be constructed to lightweight materials facilitating rapid and precise positioning of the semiconducter wafer with respect to an E-beam generating column.

7 Claims, 4 Drawing Figures

ELECTRON BEAM LITHOGRAPHIC APPARATUS

BACKGROUND OF THE INVENTION

The present invention relates to an electron beam lithographic apparatus for the fabrication of semiconducter devices and more particularly to such a system in which the wafer to be exposed is held by and traversed with respect to the electron beam by an air bearing supported puck. The apparatus can also be used to form precision reticles used in more conventional lithographic processes.

In its ongoing effort to create increasingly complex integrated circuit devices, the semiconductor industry has moved toward ever finer device geometries. The detail has become so fine, in fact, that the resolution required for lithographic processes is beginning to go beyond the defraction limits imposed by the use of visible or even ultraviolet light. Accordingly, systems are being developed which utilize electron beams or x-rays to effect the exposure of the lithographic resists which are used for the manufacture of semiconducter devices. However, while lithographic exposure with light can occur under atmospheric pressure, electron beam lithography must occur in a high vacuum. Further, since the area which can be scanned and exposed by an electron beam operating at high resolution is highly limited, i.e. a region much smaller than that of the typical semiconducter wafer, it is necessary to physically move the wafer to be exposed in relation to the electron beam source in order to expose different regions on the wafer's surface.

While a straightforward solution of this problem would be to place the wafer moving mechanisms within the vacuum system, this is unattractive in practice since these mechanisms typically involve lubricants and organic compounds which can degrade the vacuum and quickly poison the electron emissive cathode employed to generate the electron beam. Accordingly, it is deemed preferable that the stage or other means for carrying the semiconductor wafer extend outside of the vacuum chamber for connection to the mechanical drive mechanisms.

Similarly while airbearings have been widely used for supporting both semiconducter wafers and various mechanism elements including X-Y stages, the use of such bearings in connection with vacuum systems has not been widely accepted not only because the vacuum pumping requirements are increased by the gas introduced through the air bearing, but also because the atmospheric pressure opposing the vacuum has typically placed both an unacceptable heavy mechanical load on the system. The atmospheric load places strains on the moving parts which, no matter how heavily constructed, exhibit some distortion. This distortion interferes understandably with the precise positioning of the semiconducter wafer being carried by the mechanism. Further, since the moving parts subjected to the vacuum must be strongly and heavily constructed, they cannot easily be moved at the high speed which is highly desirable in order to effect rapid repositioning of a semiconducter wafer in order to obtain maximum throughput of the lithographic machine.

Among the several objects of the present invention there may be noted the provision of an electron beam lithographic system for the manufacture of semiconducter devices; the provision of such a system which provides rapid and precise positioning of a semiconducter wafer with respect to an electron beam source; the provision of such a system in which the wafer transporting stage may be of relatively light construction to facilitate rapid positioning and reasonable power requirements; the provision of such a system in which facilitates the maintenance of a high vacuum in the environment of the electron beam source; the provision of such a system which does not subject the wafer carrying stage to heavy distorting forces; the provision of such a system in which the wafer carrying stage may be moved without substantial friction; the provision of such a system which is highly reliable and which is of relatively simple and inexpensive construction. Other objects and features will be in part apparent and in part pointed out hereinafter.

BRIEF DESCRIPTION OF THE DRAWING

Corresponding reference characters indicate corresponding parts throughout the several views of the drawings.

DESCRIPTION OF THE PREFERRED EMBODIMENTS

Figure 1:
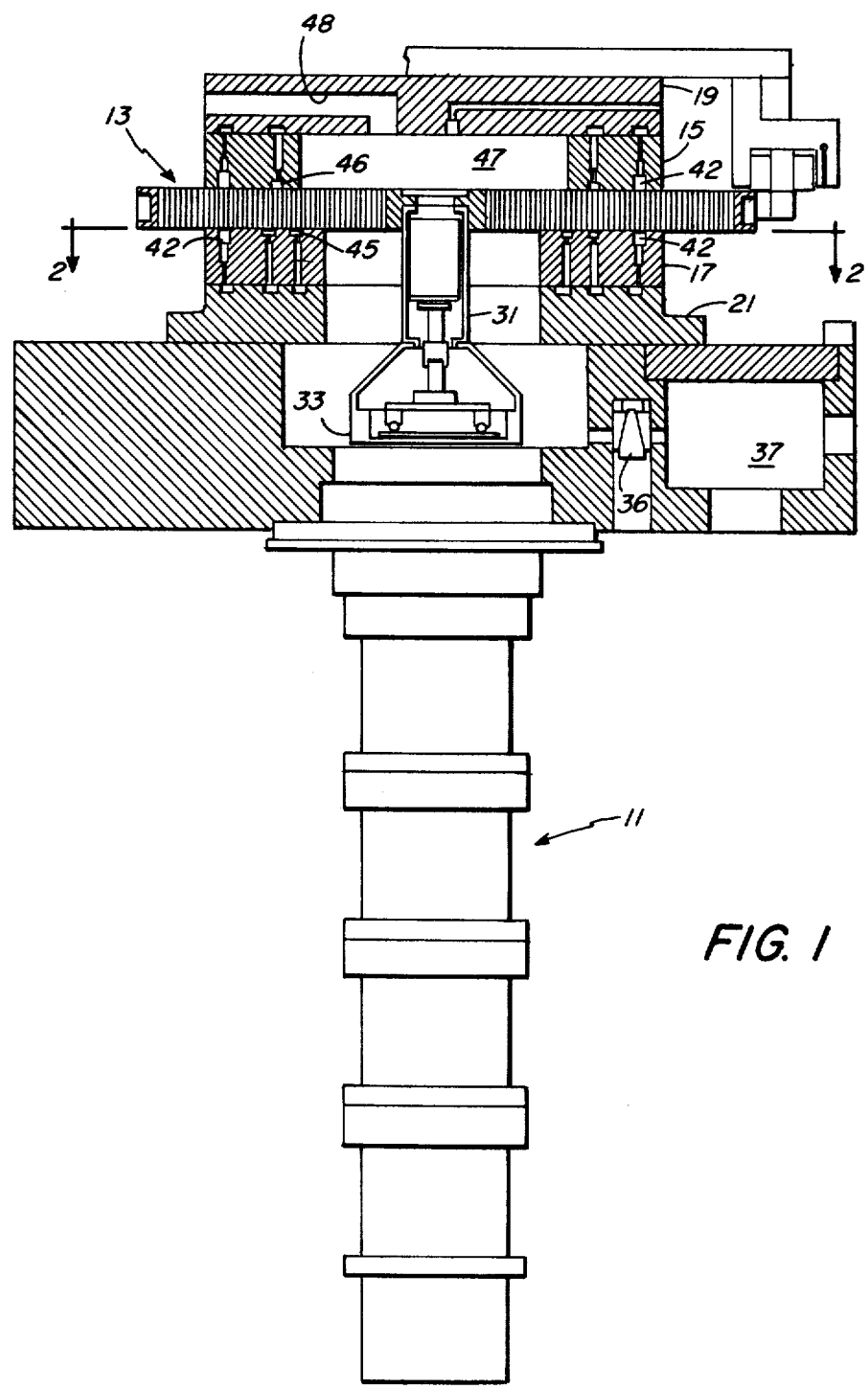
FIG. 1 is a diagramatic illustration in elevation and with parts broken away of an electron beam lithographic system constructed in accordance with the present invention.

Referring now to FIG. 1 an upwardly aimed electron beam projector is indicated generally by reference character 11. As is understood, such guns can be constructed to provide extremely high resolution but the region over which scanning can take place is quite limited, e.g. 200 by 200 millimeters. In order to expose the entire surface of a semiconducter wafer, which may be in the order of 3 to 5 inches in diameter, it is thus necessary to move the wafer around so the different regions on the wafer surface may be brought into allignment with the gun for exposure. In accordance with the present invention, the function of an X-Y stage for transporting the wafer is provided by a plate like air bearing puck, designated generally by reference character 13.

Puck 13 is supported between a pair of airbearing plates 15 and 17 which provide oppositely facing locating surfaces. Bearing plates 15 and 17 are backed up by respective or manifold plenum structures, designated by reference characters 19 and 21 respectively. As is explained in greater detail hereinafter, the air bearing plates with their respective manifolds provide annular regions of pressurization and evacuation which effectively support the puck 13 without physical contact, while allowing a vacuum to be maintained within the apparatus.

Mounted on the lower face of the puck 13 is a column 31 which carries a chuck 33 suitable for holding a semiconducter wafer or reticle for exposure in apparatus in accordance with the present invention. Semiconducter wafers are preferably mounted in individual holders which are in turn received by the chuck rather than having the chuck directly engage the semiconductor wafers themselves, such direct contact being a possible source of microscopic debris harmful to the operation of the machine. Column 31 extends down through central apertures in the air bearing plate 17 and the manifold 21. These apertures are sized so that the puck with the wafer can move laterally sufficiently to bring any part of the wafer into alignment with the axis of the electron gun 11. An airlock gate 36 and wafer loading cassette mechanism, designated generally by reference character 37, are located to one side of the evacuated chamber and are arranged so that wafers can be loaded and unloaded from the chuck 33 when the puck 13 has been positioned so as to bring the chuck 33 into registration with the loading mechanism. The details and drive mechanisms for these elements have been omitted from the drawing so as to not obscure the invention.

Figure 2:
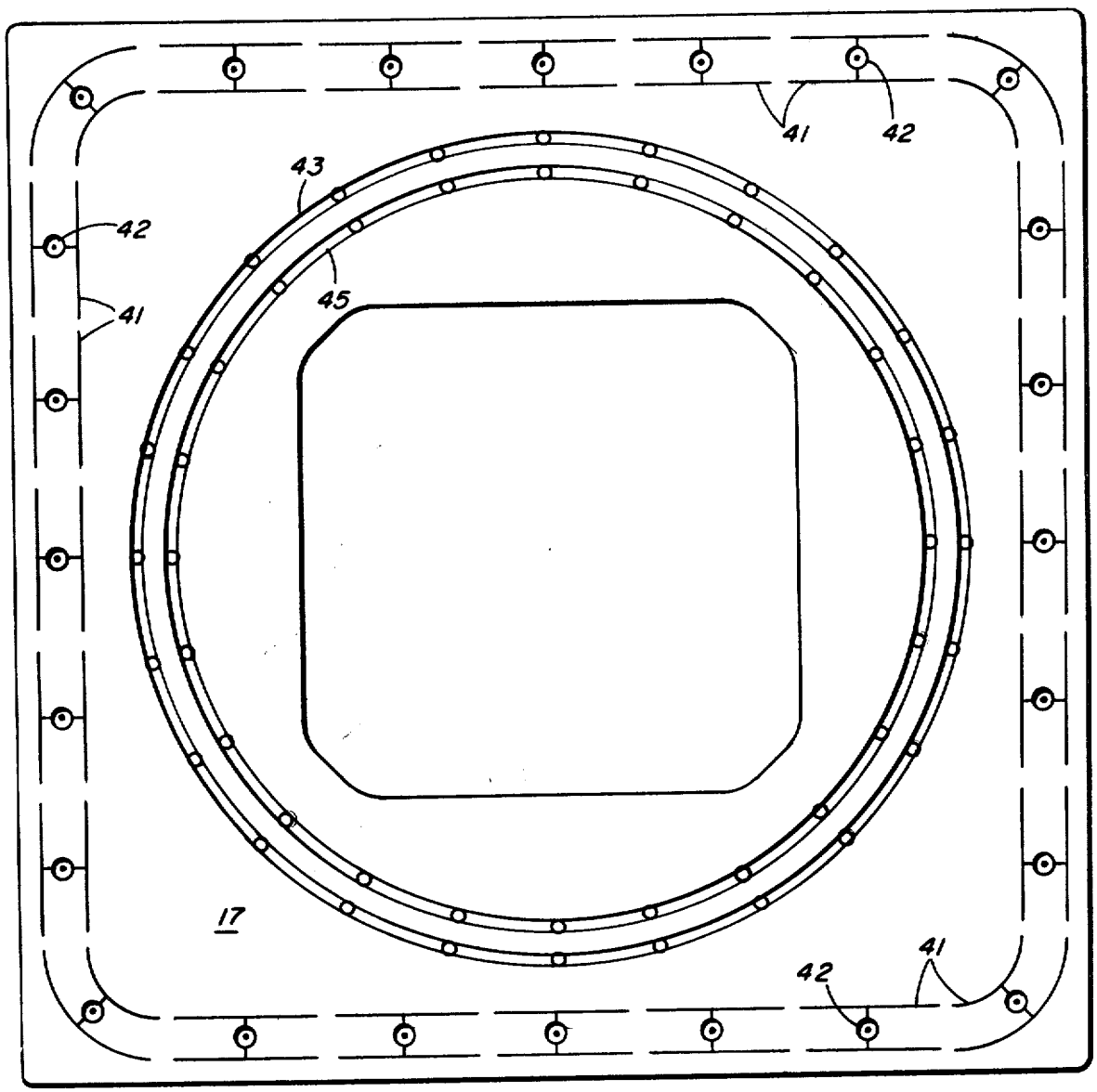
FIG. 2 is a sectional view taken substantially on the line 2—2 of FIG. 1 showing a supporting surface provided by air bearing apparatus employed in the FIG. 1 system.

In order to allow the puck 13 to move essentially without friction, it is supported on a cushion of air, i.e. an air bearing. With reference to FIG. 2, it may be seen that the air bearing plate 17 is provided around its periphery with a plurality of H-shaped grooves 41. As may be seen, the groove pattern follows the outer periphery of the bearing plate forming an overall square contour with rounded corners. At the middle of the cross-bar of each H-groove, there is provided a metering valve 42 which controls and limits flow into that groove structure. Clean air under pressure is provided to the H-shaped grooves, i.e. through the metering valves 42, from the manifold structure 21 and this air flow provides an air cushion between the upper face of the bearing structure 17 and the lower face of the puck 13. As is understood, in order to provide the greatest precision in location and minimum air loss, the mating surfaces of the air bearing plates 15 and 17 and of the puck 13 are finished to a high degree of flatness and surface smoothness. Each H-shaped groove 41 distributes the air supplied through its respective metering valve to create a region of supporting pressure. The adjacent regions together form an annular zone of pressure between the air bearing plate 17 and the puck 13.

As indicated previously, the chamber in which the wafer is exposed by the electron beam is maintained under a high vacuum. As some of the gas from the airbearing will necessarily flow toward the evacuated chamber, a pair of grooves 43 and 45 are provided inboard of the groove 41 and these grooves are provided with successively greater levels of vacuum pumping through the manifold structure 21 so as to vent and scavenge the inwardly escaping gas. Again, the amount of escaping gas is held to a minimum by observing close tolerances between the facing surfaces of the puck and air bearing plates.

If the upper surface of the puck 13 were exposed to the atmosphere as would be the case in conventional air bearing stage systems, the puck would be subjected to substantial distorting forces since the atmospheric pressure over the central area of the puck would typically amount to several tons. In order to resist these forces without unacceptable distortion, the puck would have to be massively constructed so as to provide the requisite stiffness. Such massiveness would, of course, impair rapid, precise movement of the puck. In accordance with the present invention, however, a second air bearing plate 15 is provided on the upper side of the puck 13. The upper air bearing plate 15 is essentially the complement of the lower air bearing plate 17 and provides both a peripheral array of H-shaped grooves 41 and at least one pumping groove 46 inboard of the air bearing area for supporting a central evacuated area. In order to balance the forces on the puck 13, the upper air bearing plate 15 includes a central aperture 47 which is evacuated, i.e. through a port 48 as indicated. As will be understood, this region does not have to be maintained at the very high level of vacuum appropriate for the E-beam chamber but only to a nominal level so that the total force exerted over the central region of the puck is negligible in comparison with its stiffness. Likewise, since a high degree of vacuum need not be maintained, a single scavenging groove inboard of the air bearing may be sufficient to maintain differential pumping between the air bearing region and the central evacuated region. As will be understood, the top manifold plate 19 must be relatively strongly constructed since it must bear the heavy atmospheric forces which, by the present invention, have been taken off the puck 13.

A series of frame members 51–54 extend from the main vacuum chamber, out around the space which can be swept by the puck 13, to secure the upper airbearing and manifold structure and to thereby maintain the upper and lower air bearing plates 15 and 19 in substantial alignment. While these frame members serve to locate this capped structure in a lateral sense, they do not really perform the function of supporting this structure during operation since the airbearings effectively perform this function.

Traversing of the puck 13 in the X and Y directions is provided by a system of servo motors, indicated at 61 and 63 respectively, each of which is provided with a suitable position encoder for feedback control purposes.

Figure 3:
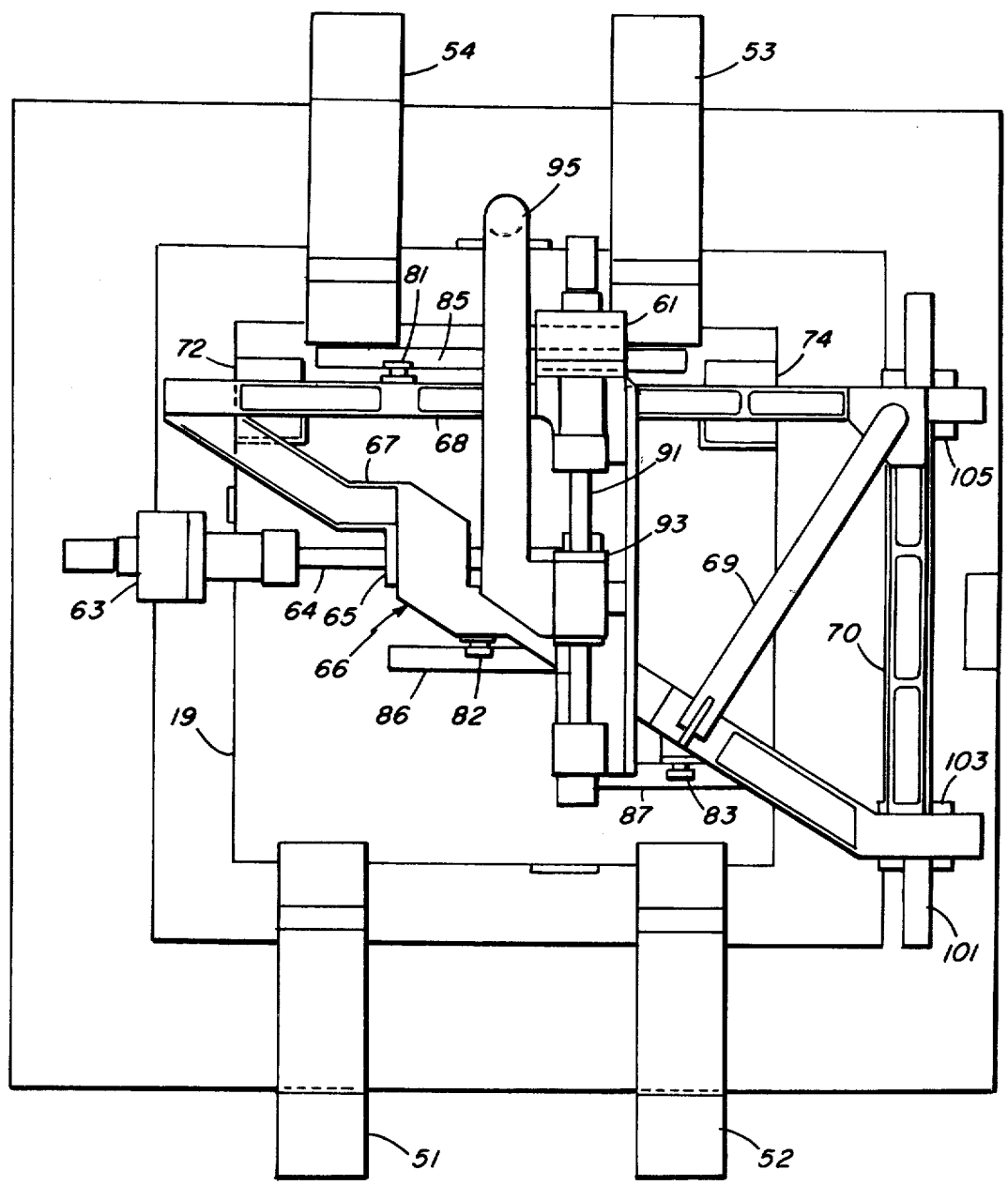
FIG. 3 is a top view of the system.
Figure 4:
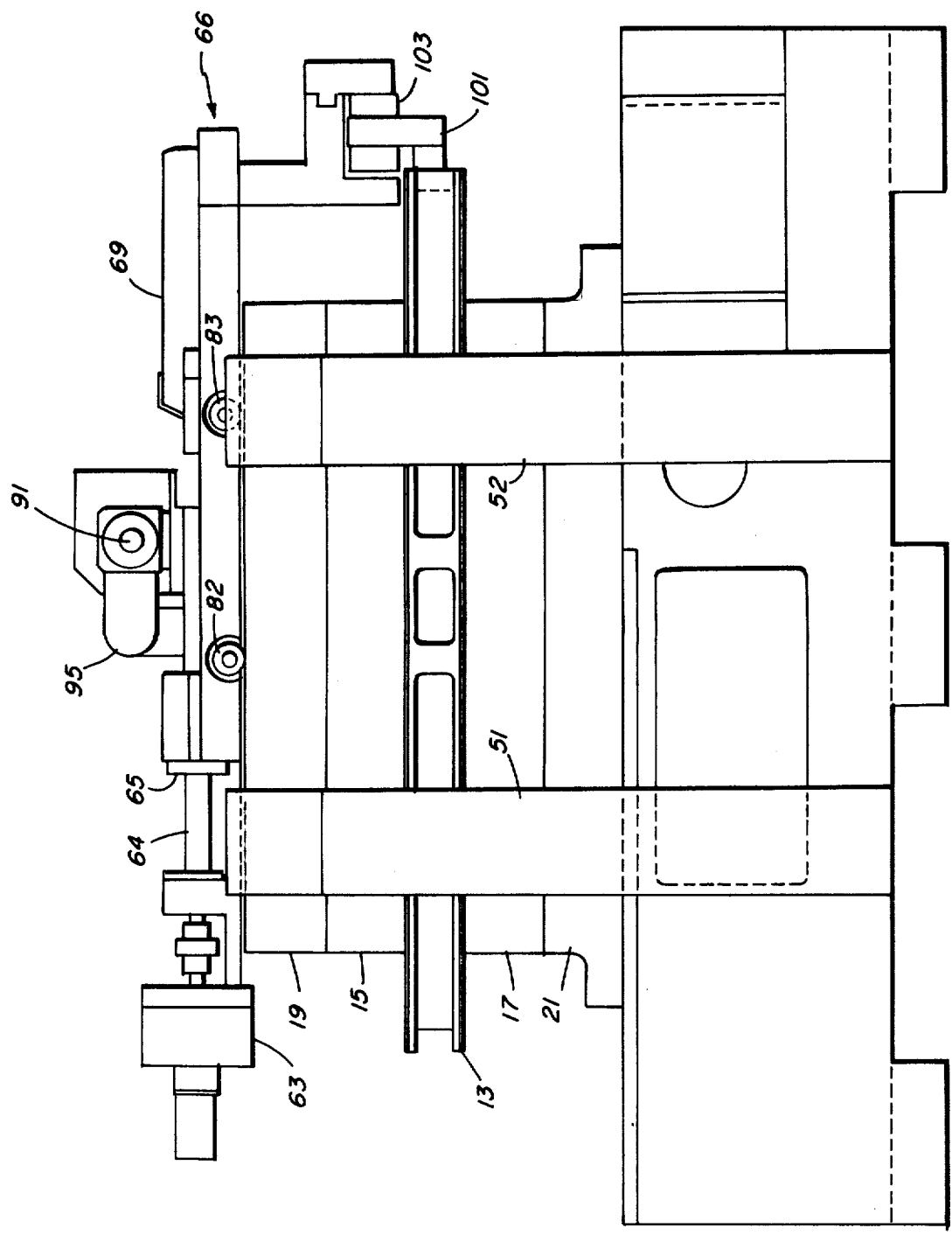
FIG. 4 is a side view of the system.

The Y-axis servo motor 63 is stationary, being mounted directly on the upper manifold structure 19. Y-axis servo motor 63 drives a lead screw 64 which in turn positions a recirculating ball nut 65 along the Y-axis. Carried along with nut 65 is a lightweight frame structure, indicated generally by reference character 66. Frame 66 is generally triangular in shape and includes a long diagonal member 67 which is directly joined with the ball nut 65; a Y-axis rail 68; a short diagonal brace 69; and an orthogonal frame member 70. Movement of the rail 68 is closely constrained along the Y-axis by a pair of air bearing yokes or guides 72 and 74. Each guide clamps the rail between a pair of air bearing surfaces. The weight of the overall frame 66 is borne by wheels 81–84 which ride on respective flats 85–88. The wheel 84 is not visible in the top view of FIG. 3 since it is beneath the X-axis servo motor 61.

The X-axis servo motor 61 is carried on and moves with the triangularly shaped frame 66. Servo motor 61 drives a lead screw 91 which in turn positions a recirculating ball nut 93 along the X-axis. Carried by nut 93 is an arm which extends horizontally along the X-axis over the side of the air bearing plate and then downwardly to the puck where it is attached for controlling the X-axis motion of the puck. It is the function of the arm 95 only to move the puck in the X-axis direction and not to otherwise constrain or locate the puck.

To constrain its motion to the desired linear format, the puck has mounted along one side thereof a straight rail 101 which extends along the X-axis. Rail 101 is constrained or aligned by a pair of air bearing yokes or guides 103 and 105. Guides 103 and 105 are essentially similar to the guides 72 and 74 which constrain movement of the triangular frame 66 along the Y-axis. The guides 103 and 105, however, are not fixed but are mounted on the movable triangular frame 66 so that the puck may be moved along either axis by the respective servo motor. As is increasingly done in such systems, coordination of the x y stage positioning with the scanning and exposure of the electron gun is coordinated by means of an appropriately programmed general purpose digital computer. However, the pressure balanced construction of the present invention may be employed with either such digital computer type controls or with dedicated electronic control circuitry which, in either case, forms no part of the present invention.

As the construction of the present invention markedly reduces the requirements for stiffness in the puck 13, it can be constructed of relatively light material. Preferably puck 13 is constructed as a laminate with a lightweight core, e.g. a pair of thin aluminum plates which constitute the working surfaces spaced apart by an aluminum honeycomb. Such a construction provides a relatively stiff plate-like structure with very low weight.

In that a puck in accordance with the present invention can be constructed with relatively low mass, it may be driven at relatively high speed using servo motors which dissipate relatively little power. As is understood by those skilled in the art, it is highly desirable to avoid the use of high-powered devices in the environment of precision semiconducter manufacturing equipment since any source of heat can introduce thermal distortions in the system and destroy the extreme precision desired.

In view of the foregoing, it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. An electron beam lithographic system for the fabrication of devices having fine geometries, said system comprising:
    means for forming an electron beam suitable for exposing a photolithographic resist and for scanning said beam over a limited region;
    a movable plate-like puck including, on one side, means for holding a device to be exposed by said electron beam;
    first puck locating means providing a first bearing surface for said puck including an annular pressurizable region for supporting said puck by gas pressure and, inwardly of said pressurizable region, evacuable region for scavenging gas escaping from between said puck and said first bearing surface, said means providing said first bearing surface including a central aperture through which said electron beam can expose a device carried by said puck;
    second puck locating means providing a second bearing surface for the side of said puck opposite said first bearing surface, said second surface also including an annular pressurizable region for maintaining a separation between said second surface and said puck and, inwardly of said pressurizable region, an evacuable region;
    frame means connecting said first and second puck locating means for holding the respective pressurizable and evacuable regions thereof in fixed alignment; and
    X-Y drive means for controllably positioning said puck with respect to said electron beam forming means thereby to permit selected portions of a device carried by said puck to be brought within the beam scanning region whereby said puck is precisely positioned between said surfaces without being subjected to distorting forces.

2. A lithographic system for the fabrication of semiconductor devices; said system comprising:
    means for forming in a vacuum an electron beam suitable for exposing a photolithographic resist and for scanning said beam over a limited region smaller than a semiconductor wafer to be exposed;
    a movable puck including, on one side, means for holding a semiconductor wafer to be exposed by said beam;
    first puck locating means providing a first bearing surface for said puck including an annular pressurizable region for supporting said puck by gas pressure and, inwardly of said pressurizable region, evacuable region for removing gas escaping from between said puck and said first bearing surface, said means providing said first bearing surface including a central aperture through which said beam can expose a device carried by said puck;
    second puck locating means providing a second bearing surface for the side of said puck opposite said first bearing surface, said second surface also including an annular pressurizable region for maintaining a separation between said second surface and said puck and, inwardly of said pressurizable region, an evacuable region;
    frame means connecting said first and second puck locating means for holding the respective pressurizable and evacuable regions thereof in fixed alignment; and
    X-Y drive means for controllably positioning said puck with respect to said electron beam forming means thereby to permit selected portions of a semiconductor wafer carried by said puck to be brought within the beam scanning region whereby said puck is precisely positioned between said surfaces without being subjected to distorting forces.

3. A system as set forth in claim 2 wherein each of said puck locating means includes, around the periphery of the respective bearing surface, a plurality of H-shaped grooves through which gas under pressure may be distributed to create a region of pressure.

4. A system as set forth in claim 3 wherein a metering valve is provided at the cross arm portion of each of said H-shaped grooves.

5. A system as set forth in claim 3 wherein each of said puck locating means includes, inwardly of the H-shaped grooves, an annular groove through which gas, escaping inwardly from the region of pressure, may be scavenged.

6. A system as set forth in claim 3 wherein said second puck locating means includes an evacuable central aperture in alignment with said beam forming means.

7. An electron beam lithographic system for the fabrication of semiconductor devices; said system comprising:
    means for forming an electron beam suitable for exposing a photolithographic resist and for scanning said beam over a limited region smaller than a semiconductor wafer to be exposed;
    a movable plate-like puck including, on one side, means for holding a semiconductor wafer to be exposed by said electron beam;

first puck locating means providing a first bearing surface smaller than said puck including an annular pressurizable region for supporting said puck by gas injected under pressure through a plurality of ports and, inwardly of said pressurizable region, an evacuable region including at least one annular groove for scavenging gas escaping inwardly from between said puck and said first bearing surface, said means providing said first bearing surface including a central aperture through which said electron beam can expose a device carried by said puck;

second puck locating means, similar to said first, providing a second bearing surface for the side of said puck opposite said first bearing surface, said second surface also including an annular pressurizable region for maintaining a separation between said second surface and said puck by gas injected under pressure through a plurality of ports and, inwardly of said pressurizable region, an evacuable region including at least one annular groove for scavenging gas escaping inwardly from said pressurizable region;

frame means connecting said first and second puck locating means for holding the respective pressurizable and evacuable regions thereof in fixed alignment; and X-Y drive means for controllably positioning said puck with respect to said electron beam forming means thereby to permit selected portions of a semiconductor wafer carried by said puck to be brought within the beam scanning region whereby said puck is precisely positioned between said surfaces without being subjected to distorting forces.

* * * * *